(12) United States Patent
Meyer et al.

(10) Patent No.: US 7,307,328 B2
(45) Date of Patent: Dec. 11, 2007

(54) SEMICONDUCTOR DEVICE WITH TEMPERATURE SENSOR

(75) Inventors: Thorsten Meyer, Munich (DE); Norbert Krischke, Munich (DE); Markus Zundel, Egmating (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/240,853

(22) Filed: Sep. 30, 2005

(65) Prior Publication Data

US 2006/0071700 A1   Apr. 6, 2006

(30) Foreign Application Priority Data

Sep. 30, 2004   (DE) .................... 10 2004 047 752

(51) Int. Cl.
*H01L 31/04* (2006.01)
(52) U.S. Cl. .................. 257/467; 257/370; 257/414; 257/469; 257/E27.008; 257/E27.015
(58) Field of Classification Search ............. 257/467
See application file for complete search history.

(56) References Cited

U.S. PATENT DOCUMENTS

| | | | | |
|---|---|---|---|---|
| 5,045,909 A | * | 9/1991 | Lucek et al. ............ 257/378 |
| 5,679,972 A | * | 10/1997 | Kim ........................ 257/378 |
| 6,255,892 B1 | | 7/2001 | Gartner et al. |
| 6,323,531 B1 | | 11/2001 | Sander et al. |
| 6,468,825 B1 | * | 10/2002 | Machida et al. ......... 438/48 |
| 6,835,994 B2 | | 12/2004 | Kistner et al. |
| 2003/0020131 A1 | * | 1/2003 | Asam et al. ............. 257/467 |

OTHER PUBLICATIONS

Streetman/Banerjee, Solid State Electronic Devices, 2000, Prentice Hall, Fifth Edition, pp. 301 & 302.*

* cited by examiner

*Primary Examiner*—Evan Pert
*Assistant Examiner*—Eduardo A. Rodela
(74) *Attorney, Agent, or Firm*—Dicke, Billig & Czaja PLLC

(57) ABSTRACT

A semiconductor device is disclosed. In one embodiment the semiconductor device includes a semiconductor body of which is integrated a temperature sensor for measuring the temperature prevailing in the semiconductor body. The temperature sensor has a MOS transistor and a bipolar transistor. The MOS transistor is integrated into the semiconductor body nd configured such that the substhreshold current intensity of the MOS transistor is proportional to the temperature to be measured. The subthreshold current of the MOS transistor is amplified by the bipolar transistor.

7 Claims, 3 Drawing Sheets

SEMICONDUCTOR DEVICE WITH TEMPERATURE SENSOR

CROSS-REFERENCE TO RELATED APPLICATIONS

This Utility Patent Application claims priority to German Patent Application No. DE 10 2004 047 752.3, filed on Sep. 30, 2004, which is incorporated herein by reference.

FIELD OF THE INVENTION

The invention relates to a semiconductor device, in the semiconductor body of which is integrated a temperature sensor for measuring the temperature prevailing in the semiconductor body.

BACKGROUND

If semiconductor devices have to process high currents or voltages, high temperatures may occur in the semiconductor body of the semiconductor device and, in the worst case, lead to the destruction of the semiconductor device. In order to prevent overheating of the semiconductor devices, it is known to integrate into the semiconductor body of the semiconductor device a temperature sensor for measuring the temperature prevailing in the semiconductor body. By evaluating a temperature signal supplied by the temperature sensor, it is possible to monitor the temperature within the semiconductor body. If the temperature exceeds a specific threshold value, suitable measures can then be taken for preventing destruction of the semiconductor device. By way of example, it is possible to switch off the semiconductor device when the temperature threshold value is exceeded, cf. e.g. U.S. Pat. No. 6,255,892 B1.

In the case of semiconductor devices with a temperature sensor, the temperature signal evaluation unit is usually integrated into the semiconductor device. In this case the temperature signal evaluation unit can be integrated directly together with the "rest" of the semiconductor device into a common substrate. However, this entails an increased lateral space requirement of the semiconductor device. As an alternative to this, it is possible to integrate the temperature signal evaluation unit into a separate chip, for example the driving chip of the semiconductor device, the separate chip being packed onto the semiconductor device ("chip-on-chip arrangement"), but this requires an increased outlay in the production process, cf. e.g. DE 197 28 281 C1. In both cases it is necessary to reckon with the semiconductor device being made considerably more expensive.

In order to avoid this disadvantage, it is known for the evaluation unit not to be integrated into/onto the semiconductor device, but rather into an external chip situated "outside" the semiconductor device (for example alongside the semiconductor device on a common circuit board), cf. e.g. DE 100 24 516 A1. For this purpose, two electrical connections are usually led out from the semiconductor device and connected to the external control chip. The electrical connections are usually connected to conductor tracks of a circuit board which are in turn connected to the external control chip. In the conductor tracks of the circuit board, however, the temperature signal can easily have interference pulses of other electronic devices superposed on it, which entails a corruption of the temperature signal or makes it completely impossible to measure the temperature. This problem can be combated by choosing the strength of the temperature signal to be sufficiently high.

However, previous temperature sensors only supply temperature signals whose signal strengths are relatively weak. The reason for this is that known temperature sensors measure the leakage current of a pn junction, the current intensity of which is only very small.

For these and other reasons there is a need for the present invention.

SUMMARY

The present invention provides a semiconductor device having an integrated temperature sensor. In one embodiment, the present invention provides a semiconductor device, in the semiconductor body of which is integrated a temperature sensor for measuring the temperature prevailing in the semiconductor body, wherein the temperature sensor has a MOS transistor and a bipolar transistor, the MOS transistor being integrated into the semiconductor body in such a way that the subthreshold current intensity of the MOS transistor rises or falls when there is a change in the temperature to be measured, and the MOS transistor being connected up to the bipolar transistor in such a way that the subthreshold current of the MOS transistor is amplified by the bipolar transistor.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
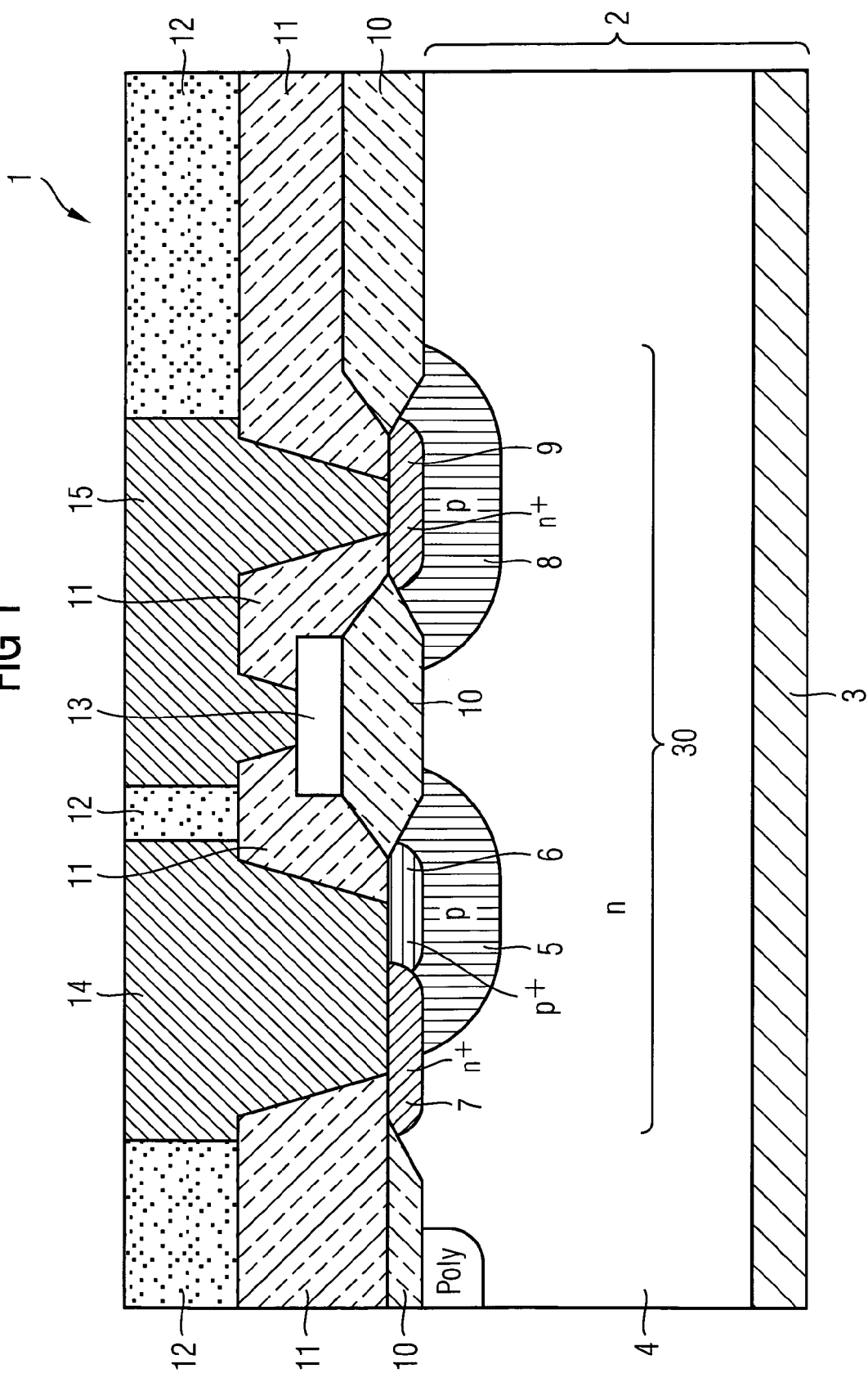
FIG. 1 illustrates a schematic cross-sectional illustration of a first embodiment of the semiconductor device according to the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a semiconductor device with temperature sensors whose temperature sensor generates a temperature signal having a sufficient signal strength, so that an evaluation of the temperature signal outside the semiconductor device cannot be impaired by interference pulses or similar effects.

In one embodiment, the semiconductor device according to the invention has a semiconductor body, into which is integrated a temperature sensor for measuring the temperature prevailing in the semiconductor body. The temperature sensor comprises a MOS transistor (metal oxide semiconductor transistor) and a bipolar transistor, the MOS transistor being integrated into the semiconductor body in such a way that the subthreshold current intensity of the MOS transistor rises or falls when there is a change in the temperature to be measured. The MOS transistor is connected up to the bipolar transistor in such a way that the subthreshold current of the MOS transistor is amplified by the bipolar transistor.

Accordingly, unlike customary practice, the temperature sensor no longer evaluates the temperature dependence of a pn diode leakage current, but rather the temperature dependence of a subthreshold current of a MOS transistor amplified by a bipolar transistor. The principle advantage in this case is that the signal strength of the temperature signal thus obtained turns out to be significantly higher in comparison with the temperature signal strengths supplied by known temperature sensors.

In one embodiment, the MOS transistor is integrated into the semiconductor body in such a way that the subthreshold current rises or falls exponentially when there is a change in the temperature to be measured.

In one embodiment, the base of the bipolar transistor is configured as a floating base.

In one embodiment, the base of the bipolar transistor constitutes the drain region of the MOS transistor, that is to say that the base of the bipolar transistor fulfils a dual function.

The MOS transistor may both be embodied as a lateral transistor and as a trench transistor. If the MOS transistor is embodied as a trench transistor, then the latter has for example a plurality of source regions, body regions, drain regions and gate electrodes provided in trenches, it being possible, by means of the gate electrodes, to generate current flows between the source regions and the drain regions through the body regions. In this case, the drain regions form the base of the bipolar transistor.

One advantage of a MOS transistor embodied in a trench design is that the channel width of the MOS transistor can turn out to be very large despite small dimensions, thus resulting in a high subthreshold current and hence a very sensitive temperature signal.

In the figures, identical or mutually corresponding regions, components or component groups are identified by the same reference numerals. Furthermore, all of the embodiments may be doped inversely, that is to say p-type regions and n-type regions may be interchanged with one another.

FIG. 1 illustrates a first embodiment of the semiconductor device according to the invention. The semiconductor device 1 has a semiconductor body 2, in which an $n^+$-doped zone 3, an n-doped zone 4, a p-doped zone 5, a $p^+$-doped zone 6, an $n^+$-doped zone 7, a p-doped zone 8 and an $n^+$-doped zone 9 are provided.

A first and a second insulation layer 10, 11 and also a passivation layer 12 are provided on the semiconductor body 2. Furthermore a gate 13 (for example made of polysilicon) and also a first and a second metal connection 14, 15 are provided.

The p-doped zones 5 and 8 are provided on the top side of the semiconductor body 2, the $n^+$-doped zone 9 being formed within the p-doped zone 8 and the $p^+$-doped zone 6 being formed within the p-doped zone 5. The $n^+$-doped zone 7 is formed partly within the n-doped zone 4 and partly within the p-doped zone 5. The first metal connection 14 makes contact with the $p^+$-doped zone 6 and also the $n^+$-doped zone 7, while the second metal connection 15 makes contact with the $n^+$-doped zone 9 and also the gate 13.

The $p^+$-doped zone 6, the p-doped zone 5, and that region of the n-doped zone 4 which lies between the $p^+$-doped zone 5 and the $p^+$-doped zone 8 form, together with the p-doped zone 8 and the gate 13, a MOS transistor, in which case the first metal connection 14 may be considered as a source connection, and the second metal connection 15 may be considered as a gate or drain connection. In this case, the zones 5 and 6 form the source zones, that region of the zone 4 which lies between the zones 5 and 8 forms the body region, and the zone 8 forms the drain region of the MOS transistor. Furthermore, that region of the zone 4 which adjoins the zone 8, the zone 8 and also the zone 9 may be regarded in their totality as a bipolar transistor.

If a potential difference occurs between the zone 5 and the zone 8, which may be obtained by applying corresponding voltage signals to the metal connections 14 and 15, then a current flows between the zones 5 and 8, even if the MOS transistor is in the off state. This current is referred to as the "subthreshold current". In this embodiment, the subthreshold current is dependent on the temperature prevailing in the semiconductor body 2. The subthreshold current is amplified by the bipolar transistor comprising the zones 4, 8 and 9. To put it more precisely, the subthreshold current drives the (floating) base 8 of the bipolar transistor, thereby effecting a significant increase in a temperature signal (forward current of the bipolar transistor) represented by the current flow tapped off at the second metal connection 15.

In this embodiment, the zone 8 thus simultaneously serves as a drain region of the MOS transistor and also as a base of the bipolar transistor. In this case, the zone 8 is configured in "floating" fashion, that is to say it is not directly contact-connected by a metal connection.

The temperature sensor illustrated in FIG. 1 may be positioned in a punctiform manner at a specific location within the semiconductor device (e.g. within the cell array). As an alternative, the zones 5 and 8 may be configured in annular fashion, that is to say enclose a cell array comprising one transistor or a plurality of transistors. The invention can be applied, in particular, to discrete power semiconductor devices and to power semiconductor devices comprising a plurality of functional elements connected in parallel (for example a cell array comprising a plurality of transistor cells).

Figure 3:
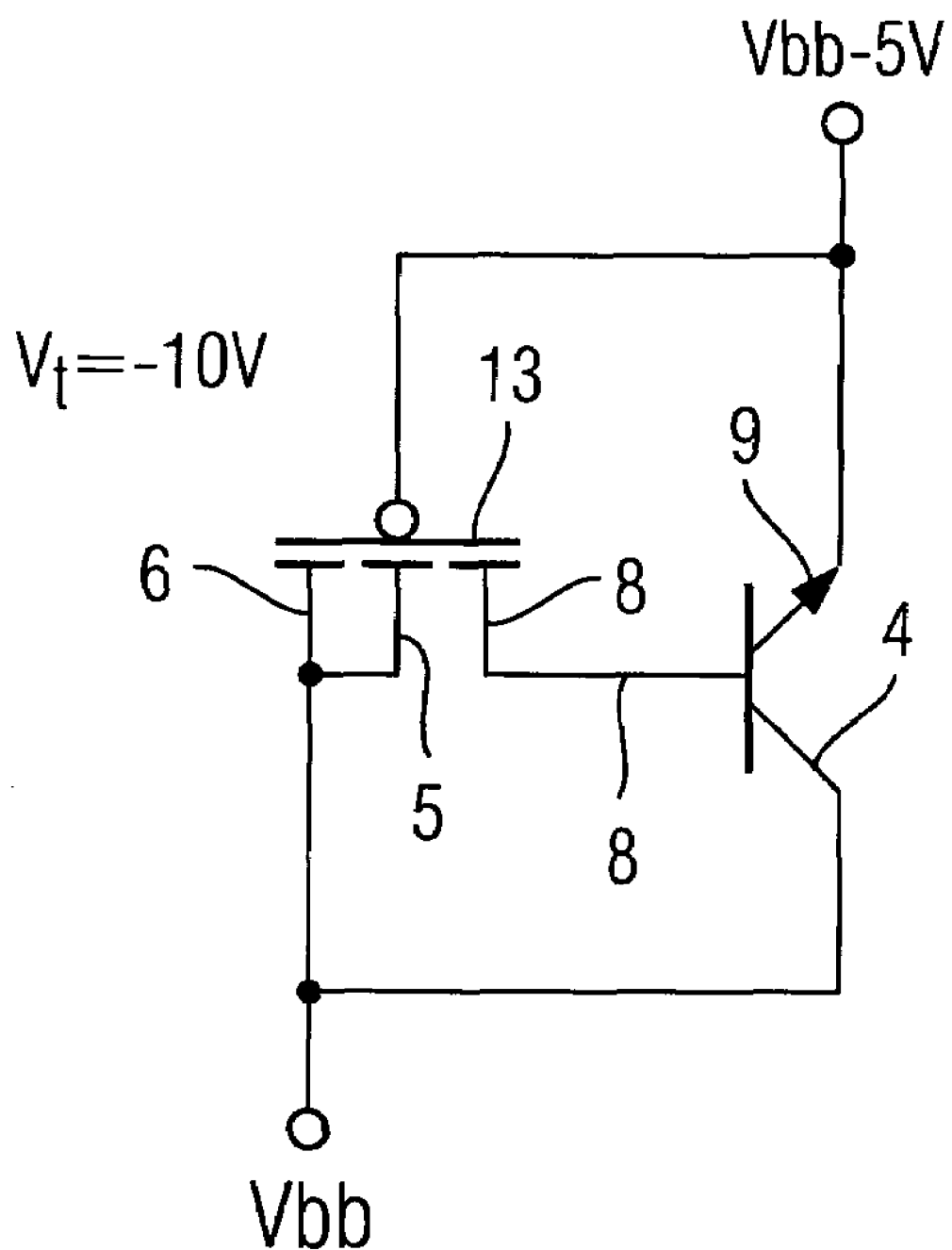
FIG. 3 illustrates a basic circuit diagram for elucidating the circuit principle on which the embodiments are based.

FIG. 3 illustrates an equivalent circuit diagram corresponding to FIG. 1. In this case, specific regions of the circuit are assigned to corresponding regions of the semiconductor device illustrated in FIG. 1.

Figure 2:
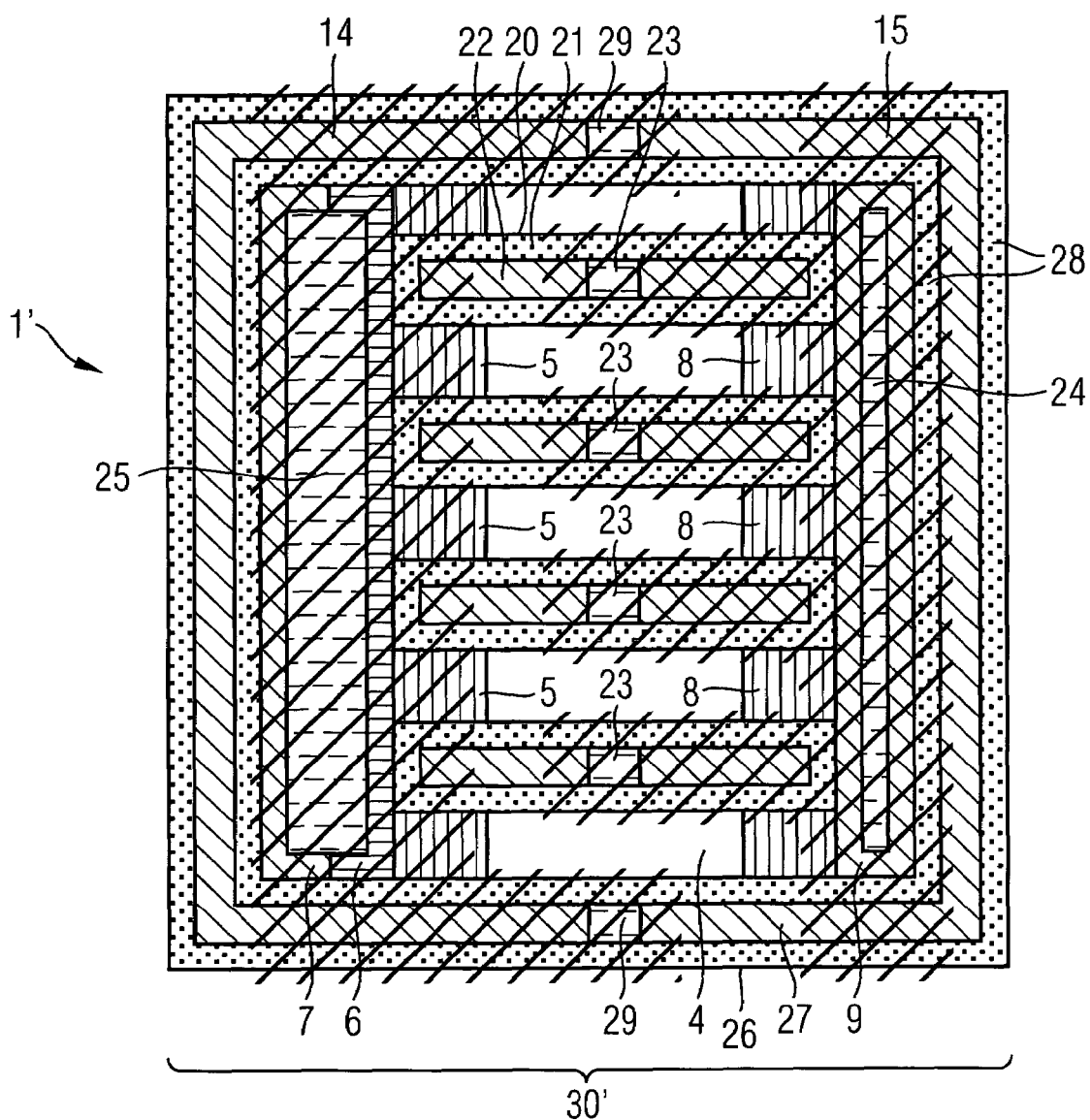
FIG. 2 illustrates a schematic plan view of a second embodiment of the semiconductor device according to the invention.

FIG. 2 illustrates a plan view of a second embodiment of the semiconductor device according to the invention. In contrast to the first embodiment, in which the temperature sensor is embodied using planar n-channel MOS switching technology, trench technology is used in this embodiment.

A temperature sensor having a plurality of trenches 20 is provided in a semiconductor device 1'. The inner walls of the trenches 20 are in each case lined with an insulation layer 21 enclosing a gate electrode 22. The gate electrode 22 is contact-connected by means of contact holes 23 and a second metallization layer 15 arranged thereabove. Arranged between the trenches 20 are p-doped zones 5 and, at a distance therefrom, p-doped zones 8. Situated above the zones 8 is an n$^+$-doped region 9, which is connected to the zones 8 and is contact-connected via a contact hole 24 and the second metallization layer 15 arranged thereabove, said second metallization layer filling the contact hole 24. The zones 5 are connected to a p$^+$-doped zone 6 and also an n$^+$-doped zone 7, which are arranged above the zones 5, the zones 6 and 7 being electrically connected to a first metallization connection 14 by means of a contact hole 25. The entire arrangement is surrounded by a trench 26, in which is provided an electrode 27 enclosed by an insulation layer 28. The electrode 27 is electrically connected to the first metallization connection 14 via contact holes 29. The actual cell array of the semiconductor device 1' is situated outside the region enclosed by the trench 26 and is not illustrated here.

In order to measure the temperature, a potential difference is applied between the first and second metal connections 14, 15, with the result that subthreshold currents form between the zones 5 and 8, which currents are amplified by the bipolar transistor, comprising the zones 4, 8 and 9, and tapped off by means of the second metal connection 15.

The advantage of a MOS transistor embodied in a trench design is that the channel width of the MOS transistor can turn out to be very large despite small dimensions (the more trenches 20 per unit area, the greater the channel width), thus resulting in a high subthreshold current and hence a very sensitive temperature signal.

Further aspects of the invention will be explained in the description below.

As already mentioned, a structure enabling the temperature of the component to be monitored is intended to be integrated into a technology for fabricating discrete low-impedance switches.

Hitherto, the required "low-impedance switch plus temperature sensor" has either been realized using a smart power technology (CMOS-DMOS (Double Diffused MOS) technology) or being fabricated using chip-on-chip technology, where the evaluation of the temperature sensor has been integrated on the driving IC.

The disadvantage of this solution resides in the significantly higher costs: in a smart power technology the wafer costs and in a chip-on-chip solution the package costs are considerably greater than for a simple discrete switch without a temperature sensor.

In order to reduce costs, it is desirable to integrate a temperature sensor into the discrete technology as far as possible without additional costs, which temperature sensor can be evaluated by an external control chip. For this purpose, the temperature signal is passed via separate connections from the switch housing to a circuit board, where it is processed by a central control chip. It is necessary in this case for the current signal of the temperature sensor to exceed a value of approximately 100 µA in the relevant temperature range of approximately 150 to 180° C. in order that interference pulses are not superposed on said current signal on the circuit board.

The temperature sensor that is customary in smart power technologies is based on the evaluation of the leakage current of a diode or of a bipolar transistor with a floating base. In the latter variant, the collector-base leakage current multiplied by the current gain of the bipolar transistor is output, that is to say ultimately a pn leakage current is also evaluated. With these constructions, it is possible (at 175° C.) only to achieve currents in the region of a few µA.

In order to solve this problem, for the purpose of measuring the temperature, the invention no longer utilizes the temperature dependence of a pn diode leakage current, but rather the temperature dependence of a subthreshold current of a MOS transistor. This current is amplified by an integrated bipolar transistor. Overall, the temperature sensor according to the invention forms an insulated base transistor (IBT).

The concept according to the invention may, on the one hand, be embodied in planar fashion:
  It is necessary that implanted p$^+$-type and n$^+$-type regions can be connected separately
  The DMOS body is utilized as bipolar base and MOS drain
  DMOS gate poly is utilized as field oxide transistor gate electrode
  Thick oxide in the edge of the DMOS is utilized as field oxide transistor gate dielectric The concept according to the invention may, on the other hand, be embodied using trench technology:
  It is necessary that p$^+$-type and n$^+$-type implantations can be connected separately
  The DMOS body is utilized as bipolar base and MOS drain
  DMOS gate poly in the edge trench is utilized as thick oxide transistor gate electrode
  Thick oxide in the edge trench is utilized as thick oxide transistor gate dielectric One advantage of this embodiment is the large channel width as a result of trench sidewalls and trench bottom.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a semiconductor body; and
   a temperature sensor integrated in the semiconductor body, the temperature sensor comprising a MOS transistor and a bipolar transistor connected to the MOS transistor;
   wherein:
     the MOS transistor comprises a source region and a drain region having a second conductivity type opposite to the first conductivity type, a section of the semiconductor body arranged between the source region and the drain region forming a body region of the MOS transistor,
     the bipolar transistor comprises controlled electrode regions consisting of the section of the semiconductor body arranged between the source region and the drain region and of a highly doped region of the first conductivity type forming a pn junction with the drain zone so that the drain region of the MOS transistor constitutes a base of the bipolar transistor which is configured as a floating base,
     the highly doped region of the bipolar transistor is electrically connected to a gate electrode of the MOS transistor, and the temperature sensor further comprises first and second metal connections each for supplying respective operation potentials to the source region and the highly doped zone of the bipolar transistor for operating the temperature sensor such that a sub-threshold current of the MOS transistor that changes upon temperature change of the semiconductor body is amplified by the bipolar transistor.

2. The semiconductor device of claim 1, wherein the MOS transistor is embodied as a trench transistor comprising plural gate electrodes respectively formed within a plurality of trenches lined with an insulation layer and further a plurality of source regions, body regions and drain regions respectively located between the trenches, wherein the highly doped zone of the bipolar transistor forming the pn junction with the drain zones being situated above the drain zones.

3. A temperature sensor for measuring temperature in a semiconductor device, comprising:
   a MOS transistor integrated into a body of the semiconductor device, the MOS transistor including a source and drain regions and a gate electrode;
   a bipolar transistor integrated into the body of the semiconductor device, the drain region of the of MOS transistor forming a base of the bipolar transistor, a section of the semiconductor body between the source and drain regions forming a first controlled electrode region of the bipolar transistor, a highly doped region of the semiconductor body forming a second controlled electrode region of the bipolar transistor, the second controlled electrode region being electrically connected to the gate electrode;
   a first terminal connected to the source region;
   a second terminal connected to the gate electrode and the second controlled electrode region;
   wherein a subthreshold current of the MOS transistor established by a difference in potential of voltage signals received by the first and second terminals is amplified by the bipolar transistor.

4. The temperature sensor of claim 3, wherein the subthreshold current rises or falls exponentially when there is a change in the temperature of the semiconductor body.

5. The temperature sensor of claim 3, wherein the base of the bipolar transistor is configured as a floating base.

6. The temperature sensor of claim 3, wherein the MOS transistor is embodied as a trench transistor.

7. The temperature sensor of claim 6, wherein the trench transistor has a plurality of source regions, body regions, drain regions and gate electrodes provided in trenches, and configured via the gate electrodes to generate current flows between the source regions and the drain regions through the body regions.

* * * * *